(12) United States Patent
Lew et al.

(10) Patent No.: US 8,066,814 B2
(45) Date of Patent: Nov. 29, 2011

(54) CRYSTAL-GROWING FURNACE HAVING SLURRY DRAINAGE DUCT STRUCTURE

(75) Inventors: Shiow-Jeng Lew, Taipei (TW); Hur-Lon Lin, Taipei (TW)

(73) Assignee: Green Energy Technology Inc., Taipei (TW)

(*) Notice: Subject to any disclaimer, the term of this patent is extended or adjusted under 35 U.S.C. 154(b) by 854 days.

(21) Appl. No.: 12/153,916

(22) Filed: May 28, 2008

(65) Prior Publication Data
US 2009/0175767 A1 Jul. 9, 2009

(30) Foreign Application Priority Data
Jan. 3, 2008 (TW) .............................. 97100177 A (51) Int. Cl.
*C30B 11/00* (2006.01)
(52) U.S. Cl. ........ 117/206; 117/201; 117/202; 422/109; 422/110; 422/111; 422/245.1; 373/110
(58) Field of Classification Search .................. 422/109, 422/110, 111, 245.1; 117/201, 202, 206, 117/900; 373/110
See application file for complete search history.

(56) References Cited

U.S. PATENT DOCUMENTS
2002/0157602 A1* 10/2002 Mizuishi et al. .............. 117/213
2010/0051108 A1* 3/2010 Cliber et al. ...................... 137/1
* cited by examiner

*Primary Examiner* — Michael Kornakov
*Assistant Examiner* — Kenneth A Bratland, Jr.
(74) *Attorney, Agent, or Firm* — Bacon & Thomas, PLLC (57) ABSTRACT

A crystal-growing furnace having a slurry drainage duct structure includes a furnace body, a supporting table, a loading frame, a plurality of eaves elements, and a set of eaves gutters. The supporting table includes a table plate and a plurality of supporting posts. The loading frame includes a lower plate and four side plates, where four elongated eaves boards descend from sides of the lower plate. Four eaves gutters, having V-shaped grooves, are connected with one another and disposed beneath the four eaves elements correspondingly. Any high-temperature silicon slurry leaks from a furnace crucible will be guided by the elongated eaves boards into the V-shaped grooves of the eaves gutters to prevent the silicon slurry from flowing along the periphery of the table plate and down to the supporting posts.

13 Claims, 7 Drawing Sheets

CRYSTAL-GROWING FURNACE HAVING SLURRY DRAINAGE DUCT STRUCTURE

BACKGROUND OF THE INVENTION

1. Field of the Invention

The present invention relates to a crystal-growing furnace, more particularly, to a furnace for growing multiple or single crystal of silicon where the crystal-growing furnace has a slurry drainage duct structure.

2. Description of Related Art

Figure 1:
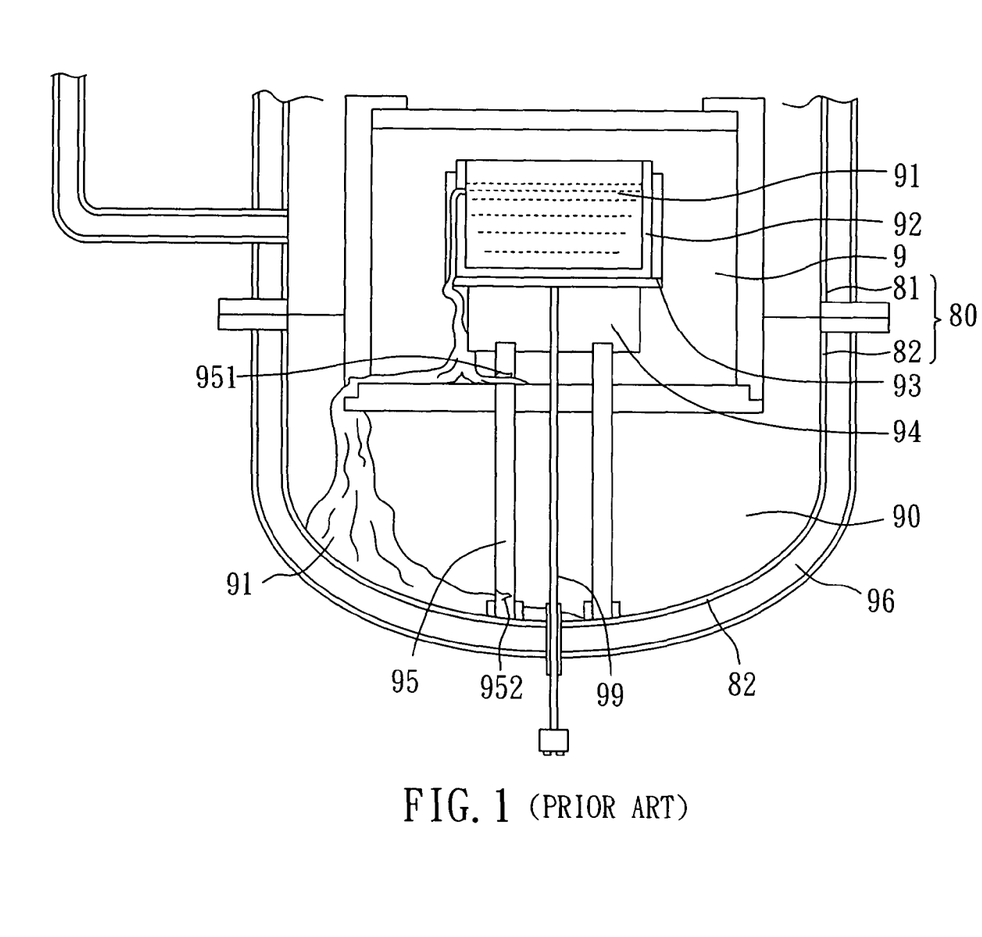
FIG. 1 is a schematic view illustrating a conventional crystal-growing furnace.

Referring to FIG. 1, a schematic view illustrating a conventional crystal-growing furnace, a heating room 9 is provided inside the furnace where a table plate 94 and a loading frame 93 are arranged inside the heating room 9. A crucible 92 is disposed inside the loading frame 93 where the crucible 92 contains molten silicon slurry 91. Three supporting posts 95 are fixed at the bottom of the furnace, with the supporting posts 95 supportively arranged underneath the table plate 94, the loading frame 93 and the crucible 92.

Generally, the crucible 92 is made of silica (quartz) having a softening point of about 1400° C., however the molten silicon slurry 91 has a temperature of about 1412° C. As a result, when the silicon slurry 91 is at a molten state, the crucible 92 will become softened due to containing the high-temperature silicon slurry 91. To sustain a lateral force exerting on the crucible 92 by the silicon slurry 91, the loading frame 93, made of graphite,P is assembled around the crucible 92 so as to reinforce the crucible 92 in loading the silicon slurry 91.

After a long-time operation, the crystal-growing furnace suffers a reciprocal high-temperature and cooling state, resulting in occasional slits at bottom or sides of the crucible 92. Under the weight of the silicon slurry 91, the silicon slurry 91 squeezes out from the slits. And since the loading frame 93 is not tightly sealed, the silicon slurry 91 drains out from slits of the loading frame 93. The silicon slurry 91 is viscous and easy to adhere to the graphite table plate 94 so as to flow along the table plate 94 until the graphite supporting posts 95. Continuous accumulation of the silicon slurry 91 onto the supporting posts 95 will result in cracks 951, 952 on them and thus breakage of the supporting posts 95. This will make the crucible 92 fall down, and as such, the silicon slurry 91 erodes inner wall of the lower body 82 of the furnace. In particular, the lower body 82 is weak at a location that a thermocouple 99 passes through the lower body 82. Accordingly, a great amount of cooling water will flow from a jacket 96 into a furnace chamber 90. At this moment, water, the silicon slurry 91, and graphite will react furiously at high temperature, releasing a great amount of hydrogen ($H_2$), carbon monoxide (CO), and steam, where the chemical reaction formula is directed to:

$2H_2O+Si \xrightarrow{\Delta} 2H_2\uparrow+SiO_2$ and $H_2O+C \xrightarrow{\Delta} H_2\uparrow+CO\uparrow$.

In case pressure inside the crystal-growing furnace increases fiercely, the furnace body 80 explodes. Upon explosion of the furnace body 80, a great amount of hydrogen ($H_2$) and carbon monoxide (CO) released from inside of the furnace, react with ambient oxygen (O2) so that continuous explosions occur. This not only bursts the crystal-growing furnace, but also damages facilities around the furnace, causing an accident on public security.

On the other hand, suppose the silicon slurry 91 flows down to the lower body 82 of the furnace in an amount not able to erode through the inner wall of the lower body 82 and so causes the cooling water to flow into the furnace chamber 90, heat of the silicon slurry 91 will impact and result in torsion and deformation of the lower body 82. As such, the lower body 82 cannot be tightly sealed with an upper body 81 of the furnace, making leakage of air into the furnace.

SUMMARY OF THE INVENTION

The present invention is to provide a crystal-growing furnace having a slurry drainage duct structure, comprising a furnace body, a supporting table, a loading frame, a plurality of eaves elements, and a set of eaves gutters.

The furnace body includes an upper body and a lower body, wherein the lower body is attached to underneath of the upper body so as to form together an enclosed furnace chamber. The supporting table is disposed inside the furnace chamber of the furnace body, where the supporting table includes a table plate and a plurality of supporting posts such that the table plate is fixed in the lower body by the supporting posts.

The loading frame is disposed on the top of the table plate, and includes a lower plate and four side plates, where the side plates surround and stand on the lower plate which envelop and form together an inner space. The lower plate has a dimension greater than that of the table plate of the supporting table, and has a periphery surrounded with an edge which extends beyond the table plate.

A plurality of eaves elements are provided around the edge of the lower plate of the loading frame. The eaves gutters are disposed inside of the lower body, beneath the plural eaves elements correspondingly. Therefore, in case high-temperature silicon slurry leaks and drains from the crucible of the loading frame, the silicon slurry will first be guided and flows along elongated eaves boards and down into V-shaped grooves of the eaves gutters so as to prevent the silicon slurry from flowing along periphery of the table plate and down to the supporting posts, and to protect the supporting posts from being eroded and broken apart or falling down of the crucible and silicon slurry flooding.

The eaves elements include four elongated eaves boards, that the lower plate of the loading frame may be a square graphite board, and that the four elongated eaves boards are fixed to and descend from sides of the edge of the lower plate. A plurality of anchoring means are arranged inside of the eaves gutters to secure a thermo-break sensor wire in the eaves gutters. When leaking silicon slurry is guided and drips into the eaves gutters, the thermo-break sensor wire will be melted apart so as to turn off heaters immediately and to cool down and solidify the silicon slurry. The eaves gutter includes an inner edge and an outer edge, wherein the inner edge is higher than the outer edge and a side descends from the outer edge. The eaves gutters include a plurality of V-shaped grooves, semi-circular grooves, or square grooves, which are connected with one another so as to form a frame body.

Further, the crystal-growing furnace includes a receiving pan disposed inside of the bottom of the lower body and beneath, correspondingly to, the plural eaves elements and the eaves gutters but far away from the plural supporting posts of the supporting table. The receiving pan includes a square inner edge and a curved outer edge, where the square inner edge is located beneath the eaves gutters and far away from the plural supporting posts, and where the curved outer edge is disposed inside the bottom of the lower body. In view of the fact that the receiving pan is additionally provided for containing a great amount of the leaking silicon slurry so as to block the silicon slurry from flowing close to the supporting posts. This will protect the supporting posts and the furnace body from being damaged.

The receiving pan also includes a thermostat having a thermocouple, where the thermostat is disposed at the bottom of the receiving pan. The receiving pan includes at least one copper receiving pan, where a great amount of silicon slurry leaks and flows over the eaves gutters and into the receiving pan, such that the receiving pan will have a higher temperature. Upon detecting a temperature rise, the thermostat sends a signal to an external controlling system so as to actuate a rapid cooling device and to cool down the silicon slurry immediately.

According to the present invention, the crystal-growing furnace includes a heating room accommodated in the furnace chamber of the furnace body, and includes therein the table plate and the loading frame. The heating room includes a lower partition surrounded with an outer edge and disposed between the eaves elements and the eaves gutters, where the outer edge corresponds, downward, to the eaves gutters. The lower partition has an upper surface provided, at periphery, with a ramp, where the ramp corresponds, upward, to the eaves elements and the ramp is oblique toward edge of the periphery. The lower partition is fixed in the lower body and includes a plurality of holes and of sleeves, wherein the plural sleeves pass through the plural holes, respectively, and wherein the supporting posts are received in the plural sleeves. The sleeves serve to reinforce lateral support of the supporting table so as to block a great amount of leaking slurry from submerging the supporting posts and to protect the supporting posts from being eroded and damaged.

Further, the eaves gutters each includes an inner edge and an outer edge, where the inner edge is higher than the outer edge, so that when flowing over the eaves gutters, the silicon slurry may drip down on upper edge of the receiving pan. This will expand range of cooling, extend baffling effect of the eaves gutters, and reduce impact of heat by the silicon slurry.

Other objects, advantages, and novel features of the present invention will become more apparent from the following detailed description when taken in conjunction with the accompanying drawings.

DETAILED DESCRIPTION OF THE PREFERRED EMBODIMENTS

Figure 2:
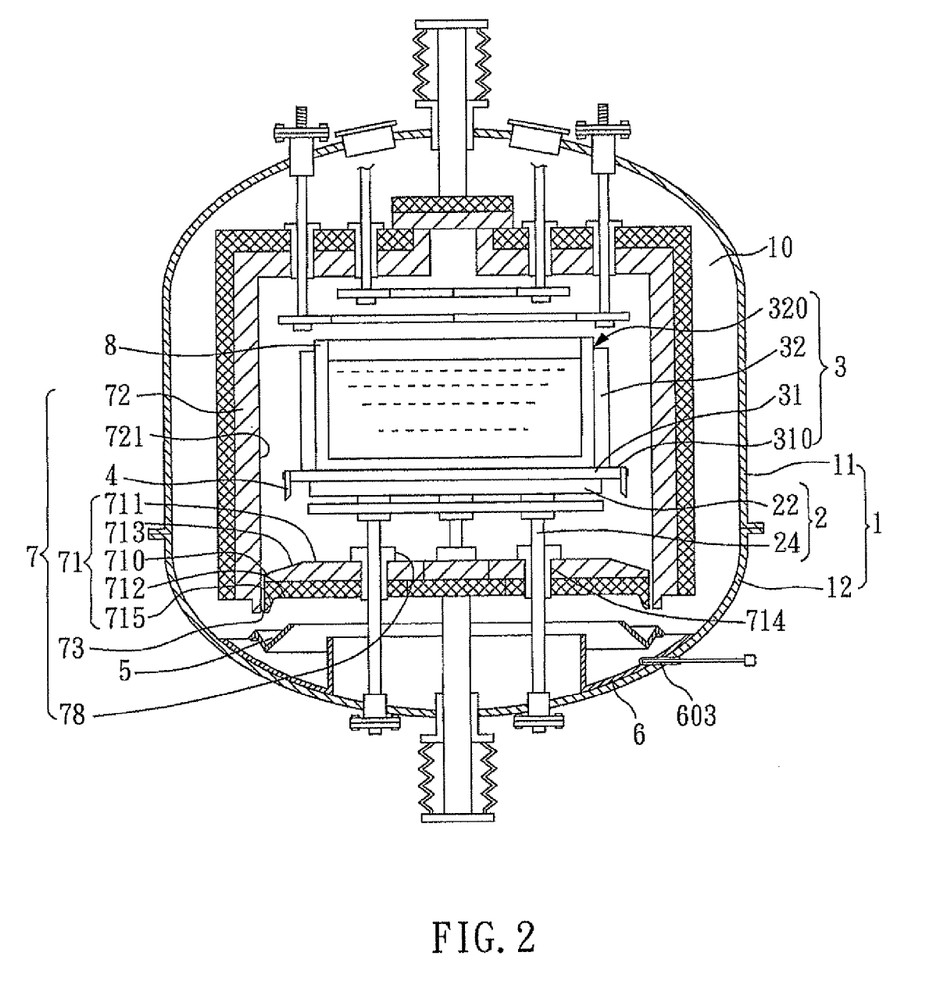
FIG. 2 is a cross-sectional view illustrating a crystal-growing furnace having a slurry drainage duct structure according to the present invention.

Referring to FIG. 2, a cross-sectional view illustrating a crystal-growing furnace having a slurry drainage duct structure according to the present invention, the furnace comprises a furnace body 1, a supporting table 2, a loading frame 3, a plurality of eaves elements 4, a set of eaves gutters 5, a receiving pan 6, and a heating room 7.

According to the present invention, the furnace body 1 includes an upper body 11 and a lower body 12, wherein the lower body 12 is attached, upward, to underneath of the upper body 11 so as to form an enclosed furnace chamber 10. The heating room 7 is accommodated in the furnace chamber 10 of the furnace body 1, and includes therein a table plate 22 and the loading frame 3. A lower partition 71 is disposed between the eaves elements 4 and the eaves gutters 5, where the lower partition 71 is surrounded with an outer edge 710 which corresponds, downward, to the eaves gutters 5.

Further, the lower partition 71 is located in the heating room 7 and has an upper surface 711 and a lower surface 712, wherein the upper surface 711 is provided, at periphery, with a ramp 713 corresponding, upward, to the eaves elements 4, where the ramp 713 is oblique outward and toward the outer edge 710. A gap 73, about 3 mm, is maintained between the outer edge 710 around the lower partition 71 and the inner wall 721 of four side partitions 72.

The supporting table 2 is disposed inside the furnace chamber 10 of the furnace body 1, with an upper portion of the supporting table 2 kept inside of the heating room 7. In the present invention, the supporting table 2 includes a table plate 22 and eight supporting posts 24 (in FIG. 2 three supporting posts 24 are shown), where the table plate 22 is fixed to the lower body 12 by the eight supporting posts 24.

The loading frame 3 is disposed on the top of the table plate 22, and includes a lower plate 31 and four side plates 32, where the side plates 32 surround and stand on the lower plate 31 which envelop and form together an inner space 320 so as to form a frame body, having a bottom, which is open at the top and close at the bottom for receiving a crucible 8, and which sustains the weight of the crucible 8 and the lateral force resulted from molten silicon slurry. The lower plate 31 has a dimension greater than that of the table plate 22 of the supporting table 2, and has a periphery surrounded with an edge 310 which extends beyond the table plate 22.

Figure 3:
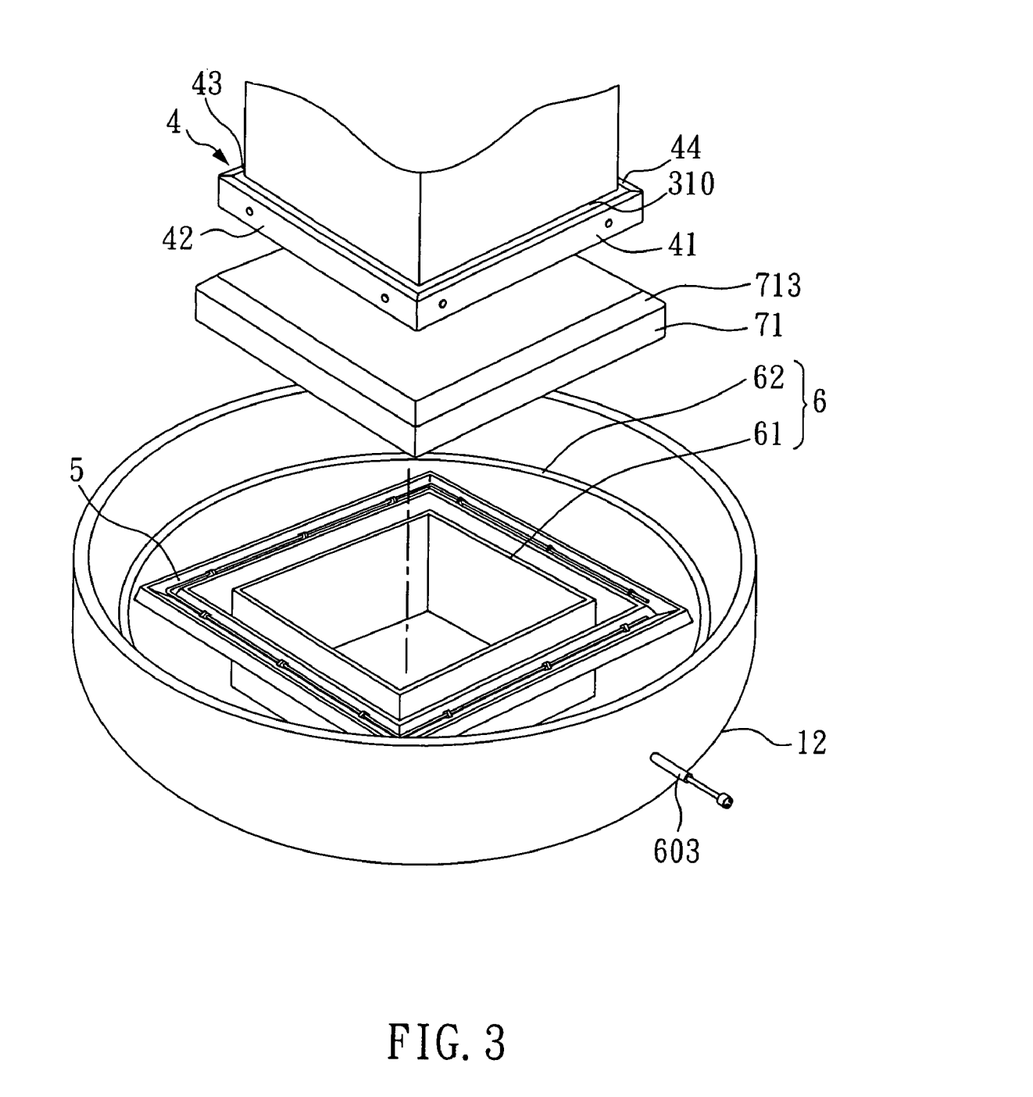
FIG. 3 is a perspective view illustrating part of the crystal-growing furnace according to the present invention.
Figure 4:
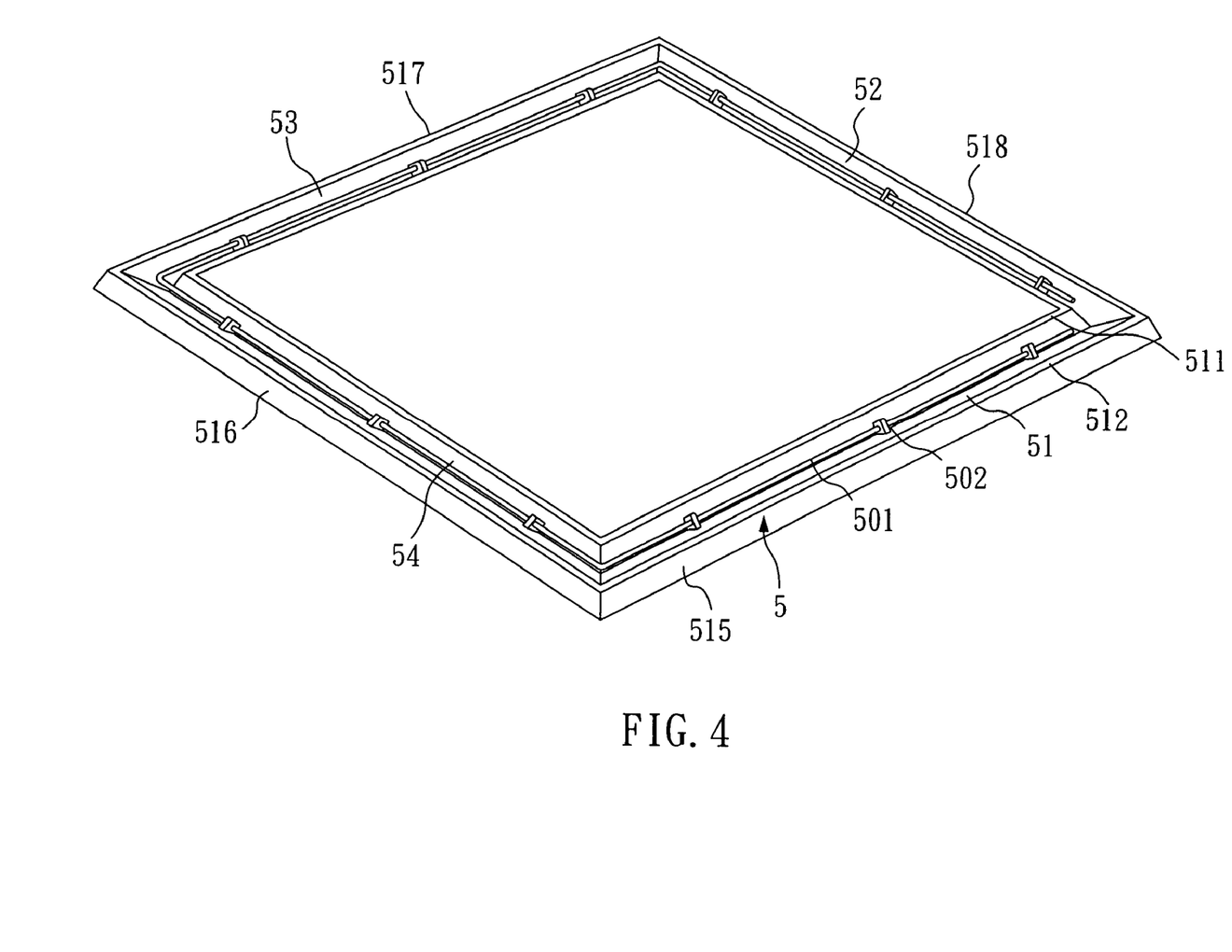
FIG. 4 is a perspective view illustrating a set of eaves gutters of the crystal-growing furnace according to the present invention.

Further referring to FIGS. 3 and 4, a perspective view illustrating part of the crystal-growing furnace according to the present invention and a perspective view illustrating a set of eaves gutters of the crystal-growing furnace, the eaves elements 4 are provided around the edge 310 of the lower plate 31 and include four elongated eaves boards 41,42,43,44. The lower plate 31 of the loading frame 3 is a square graphite board, and that the four elongated eaves boards 41,42,43,44 are fixed to and descend from sides of the edge 310 of the lower plate 31. The eaves boards 41,42,43,44 may descend perpendicularly or obliquely, appeared like eaves and named as eaves elements 4, such that the silicon slurry can be guided and drips from outer edges of the elongated eaves boards 41,42,43,44. Therefore, the silicon slurry may not adhere to, due to viscosity, and flow along underneath of the lower plate 31 to the table plate 22 and the supporting posts 24 of the supporting table 2 so as to prevent the supporting posts 24 from being damaged.

The eaves elements 4 can be mounted to the edge 310 of the lower plate 31 only after the loading frame 3, together with the crucible 8, are loaded on the supporting table 2 by a lifter. Also, prior to taking down the crucible 8, the eaves elements 4 has to be removed first so as to prevent the eaves elements 4 from being damaged.

As shown in FIG. 3, the eaves gutters 5 are disposed inside of the lower body 12, beneath the four eaves elements 4 and the ramp 713 correspondingly. As shown in FIG. 4, the eaves gutters 5 include four V-shaped grooves 51,52,53,54 which are connected with one another so as to form a frame body. A plurality of anchoring means 502 are arranged inside of the eaves gutters 5 to secure a thermo-break sensor wire 501 in the eaves gutters 5. The thermo-break sensor wire 501 may be made of stainless steel or copper.

Figure 5:
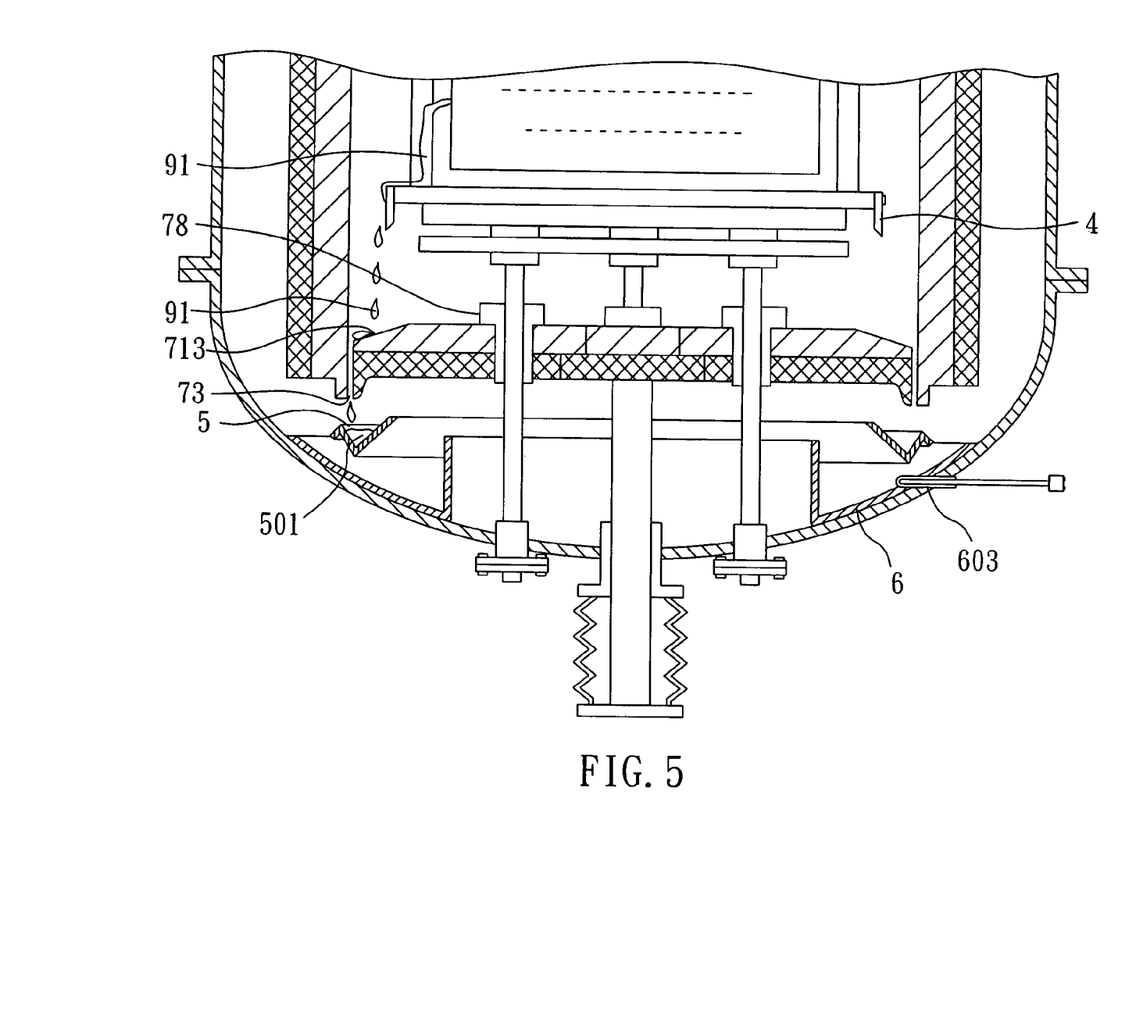
FIG. 5 is a schematic view illustrating dripping of silicon slurry from a crucible of the crystal-growing furnace according to the present invention.

Now referring to FIG. 5, a schematic view illustrating dripping of the silicon slurry from the crucible of the crystal-growing furnace according to the present invention, the silicon slurry leaks from the crucible 8 to the heating room 7, and is guided by the eaves elements 4 and drips to the ramp 713 of the lower partition 71. The silicon slurry then flows through the gap 73 and eventually down to the eaves gutters 5, acting as a drainage duct for the silicon slurry. In the mean time, the thermo-break sensor wire 501 will be melted apart while the silicon slurry flows into the eaves gutters 5.

The thermo-break sensor wire 501 is electrically connected with an external controlling center, so that when the thermo-break sensor wire 501 is melted apart and a signal is detected, the external controlling center will turn off electric power of heaters immediately so as to cool down the crucible 8. Suppose the crucible 8 has a minor crack and the silicon slurry 91 stops leaking and is solidified, the silicon slurry 91 draining to the V-shaped grooves 51,52,53,54 will be cooled down and solidified gradually acting as a baffle. On the other hand, in case the silicon slurry 91 leaks in a great amount, it will drains over the eaves gutters 5 and flows into the receiving pan 6.

Figure 6:
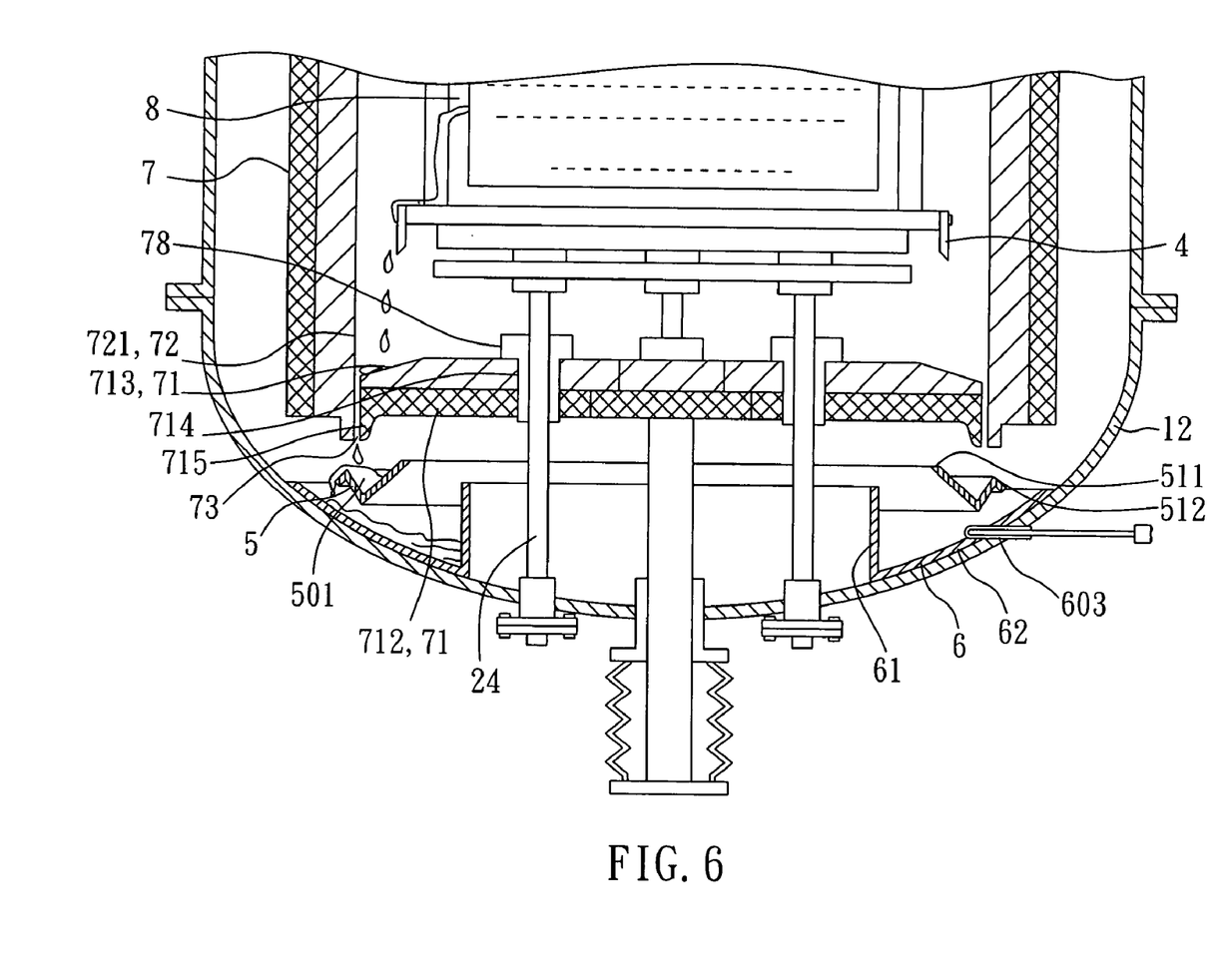
FIG. 6 is another schematic view illustrating dripping of silicon slurry from the crucible of the crystal-growing furnace according to the present invention.

Further, referring to FIG. 6, another schematic view illustrating dripping of the silicon slurry from the crucible of the crystal-growing furnace according to the present invention, the receiving pan 6 includes a thermostat 603 having a thermocouple 603, where the thermostat 603 is also electrically connected with the external controlling center. When the silicon slurry leaks to the receiving pan 6 in a great amount, the receiving pan 6 will have a higher temperature. The thermostat 603 arranged at the bottom of the receiving pan 6 detects the abnormal temperature and the electrical power of the heaters is turned off. Moreover, a rapid cooling action is actuated, making the draining silicon slurry cooled down immediately in the receiving pan 6, so that the silicon slurry is solidified and flows no more so as to prevent from any further casualty. As shown in FIG. 6, and FIG. 3 as well, the receiving pan 6 includes a square inner edge 61 and a curved outer edge 62, where the square inner edge 61 is located beneath the eaves gutters 5 and spaced from the eight supporting posts 24, and where the outer edge 62 is disposed along the surface of the bottom of the lower body 12 such that cooling can be readily achieved. In addition, the receiving pan 6 has a capacity in containing all the silicon slurry in the crucible 8.

Referring to FIGS. 4 and 6, there are four eaves gutters 5 each including an inner edge 511 and an outer edge 512, where the inner edge 511 is higher than the outer edge 512. There are four sides 515,516,517,518 descending from the outer edges 512, so that when flowing over the eaves gutters 5 and down along the sides 515,516,517,518, from upper portion to the lower portion of the outer edges 62 of the receiving pan 6, the silicon slurry is expanded and solidified. This will reduce impact of heat and thus protect the structure of the supporting posts 24 and the lower body 12.

The eaves gutters 5 serve to baffle the heat impact from the silicon slurry. To the effect, upon a small amount of leaking, the silicon slurry can be solidified in the eaves gutters 5; while upon a great amount of leaking, the silicon slurry flows over the eaves gutters 5 and is received and solidified in the receiving pan 6. Since the silicon slurry has a longer cooling time, as well as a larger cooling area, the problem of torsion and deformation that the lower body 12 may encounter due to impact of heat can therefore be overcome.

Further, as shown in FIG. 6, the lower partition 71 includes eight holes 714 and eight sleeves 78, wherein the eight sleeves 78 pass through the eight holes 714, respectively, and wherein the supporting posts 24 are received in the eight sleeves 78. The sleeves 78 serve to reinforce lateral support of the supporting table 2 so as to block a great amount of leaking slurry from submerging the supporting posts 24 and to protect the supporting posts 24 from being eroded and damaged. In addition, there is a side protrusion 715 extended around the lower surface 712 of the lower partition 71 so as to stop the silicon slurry from flowing toward the supporting posts 24.

Given the above, the leaking and high temperature molten silicon slurry can be guided, by the eaves elements 4, and flows from the loading frame 3 to the eaves gutters 5 so as to prevent the silicon slurry from flowing along periphery of the table plate 22 and down to the supporting posts 24. Or in case of a great amount of silicon slurry leakage, the sleeves 78 can be provided for protecting the supporting posts 24 from being eroded continuously by the silicon slurry or even from being broken apart. In addition, the great amount of leaking silicon slurry flowing over the eaves gutters 5 can be baffled, cooled and received in the receiving pan 6 so as to assure that the supporting posts 24 in the lower body 12 will not be eroded or broken apart, and to prevent the crucible 8 from falling down and silicon slurry flooding. Therefore, the casualty caused by explosion of the crystal-growing furnace can be avoided, and that the problem of torsion and deformation incurred to the lower body 12 due to impact of heat by the molten silicon slurry can be overcome.

Figure 7:
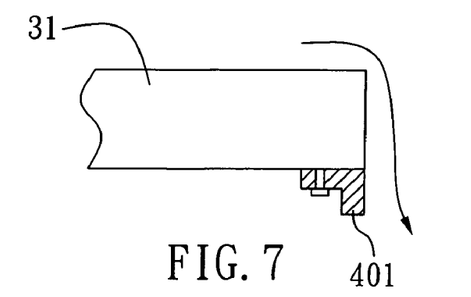
FIGS. 7 to 10 are schematic views illustrating variations of eaves elements according to the present invention.
Figure 8:
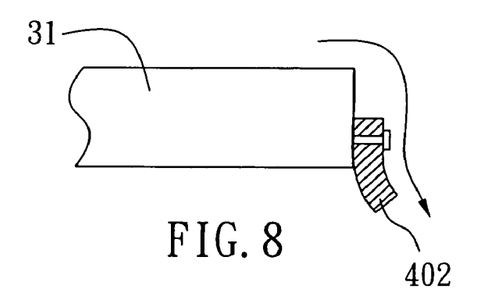
Figure 9:
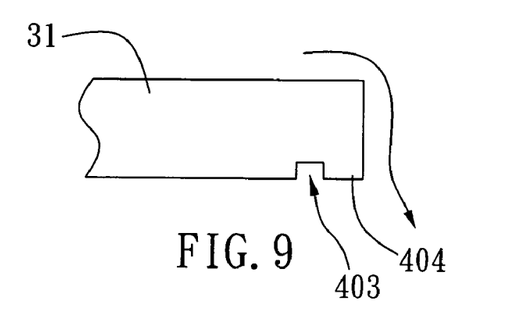
Figure 10:
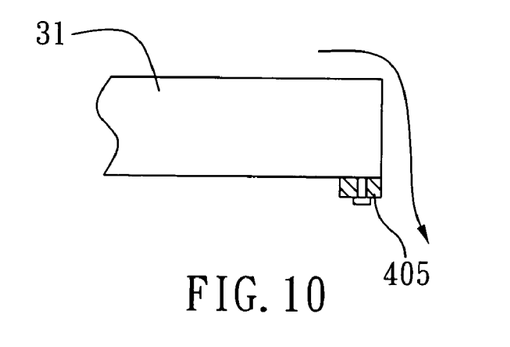

Now referring to FIGS. 7 to 10, schematic views illustrating variations of eaves elements according to the present invention, the eaves elements 401,402,405 are perpendicular or oblique, as desired, and the eaves elements 401,402,405 are secured to the side or underneath of the lower plate 31, as shown in FIGS. 7, 8, and 10. On the other hand, an equivalent can be achieved by grooving the lower plate 31 a recess 403, as shown in FIG. 9, such that a perpendicular outer eaves 404 may be formed.

Although the present invention has been explained in relation to its preferred embodiments, it is to be understood that many other possible modifications and variations can be made without departing from the scope of the invention as hereinafter claimed.

What is claimed is:

1. A crystal-growing furnace having a slurry drainage duct structure, comprising:
   a furnace body, including an upper body and a lower body, wherein the lower body is attached to underneath of the upper body so as to form together an enclosed furnace chamber;
   a supporting table, being disposed inside the furnace chamber of the furnace body, wherein the supporting table includes a table plate and a plurality of supporting posts such that the table plate is fixed to the lower body by the plural supporting posts;
   a loading frame, being disposed on the top of the table plate, and including a lower plate and plural side plates, wherein the plural side plates surround and stand on the lower plate which envelop and form together an inner space, and wherein the lower plate has a dimension greater than that of the table plate of the supporting table, and has a periphery surrounded with an edge which extends beyond the table plate;
   a plurality of eaves elements, being provided around the edge of the lower plate of the loading frame;
   a set of eaves gutters, being disposed inside of the lower body, beneath the plural eaves elements correspondingly; and
   a heating room, being accommodated in the furnace chamber of the furnace body, and including therein the table plate and the loading frame, wherein the heating room includes a lower partition surrounded with an outer edge and disposed between the eaves elements and the eaves gutters, and wherein the outer edge corresponds, downward, to the eaves gutters.

2. The crystal-growing furnace as claimed in claim 1, wherein the plural eaves elements include four elongated eaves boards, the lower plate of the loading frame is a square graphite board, and the four elongated eaves boards are fixed to and descend from sides of the edge of the lower plate.

3. The crystal-growing furnace as claimed in claim 1, wherein a thermo-break sensor wire is disposed in the set of eaves gutters.

4. The crystal-growing furnace as claimed in claim 3, wherein a plurality of anchoring means are arranged inside of the set of eaves gutters so as to secure the thermo-break sensor wire in the eaves gutters.

5. The crystal-growing furnace as claimed in claim 1, wherein the eaves gutter includes an inner edge and an outer edge, the inner edge is higher than the outer edge and a side descends from the outer edge.

6. The crystal-growing furnace as claimed in claim 1, wherein the set of eaves gutters include a plurality of V-shaped grooves which are connected with one another.

7. The crystal-growing furnace as claimed in claim 1, further comprising a receiving pan disposed inside of the bottom of the lower body and beneath, correspondingly to, the plural eaves elements and the set of eaves gutters and spaced from the plural supporting posts of the supporting table.

8. The crystal-growing furnace as claimed in claim 7, wherein the receiving pan includes a square inner edge and a curved outer edge.

9. The crystal-growing furnace as claimed in claim 7, wherein the receiving pan further includes a thermostat disposed at the bottom of the receiving pan.

10. The crystal-growing furnace as claimed in claim 9, wherein the thermostat has a thermocouple.

11. The crystal-growing furnace as claimed in claim 7, wherein the receiving pan includes at least one copper receiving pan.

12. The crystal-growing furnace as claimed in claim 1, wherein the lower partition has an upper surface provided, at periphery, with a ramp, where the ramp corresponds, upward, to the eaves elements.

13. The crystal-growing furnace as claimed in claim 12, wherein the lower partition further includes a plurality of holes and of sleeves, and wherein the plural sleeves pass through the plural holes, respectively, and the supporting posts are received in the plural sleeves.

* * * * *